(12) United States Patent
Wang et al.

(10) Patent No.: US 9,414,439 B2
(45) Date of Patent: Aug. 9, 2016

(54) BASEPLATE SUPPORTING PIN AND BASEPLATE SUPPORTING DEVICE USING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Liang Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 265 days.

(21) Appl. No.: 13/984,387

(22) PCT Filed: Mar. 19, 2013

(86) PCT No.: PCT/CN2013/072891
§ 371 (c)(1),
(2) Date: Aug. 8, 2013

(87) PCT Pub. No.: WO2013/155913
PCT Pub. Date: Oct. 24, 2013

(65) Prior Publication Data
US 2014/0054282 A1 Feb. 27, 2014

(30) Foreign Application Priority Data
Apr. 16, 2012 (CN) .................. 2012 2 0160486 U

(51) Int. Cl.
*H05B 3/06* (2006.01)
*H05B 1/02* (2006.01)
(Continued)

(52) U.S. Cl.
CPC ........ *H05B 1/0288* (2013.01); *H01L 21/67103* (2013.01); *H01L 21/67109* (2013.01); *H01L 21/68742* (2013.01)

(58) Field of Classification Search
CPC ............... H01J 2237/2001; H01J 2237/32195; C23C 16/45565; C23C 16/46; B05C 11/00; F25B 29/00; F25B 41/04; G01R 31/26; G01R 31/02; G01R 31/28; B23Q 11/12; B23Q 11/14
See application file for complete search history.

(56) References Cited

U.S. PATENT DOCUMENTS

2010/0144159 A1 6/2010 Takatsuki
2014/0054282 A1 2/2014 Wang et al.

FOREIGN PATENT DOCUMENTS

CN 101147244 A 3/2008
CN 202796877 U 3/2013
(Continued)

OTHER PUBLICATIONS

International Search Report mailed Jun. 13, 2013, PCT/CN2013/072891.
(Continued)

*Primary Examiner* — Shawntina Fuqua
(74) *Attorney, Agent, or Firm* — LADAS & PARRY LLP

(57) ABSTRACT

According to embodiments of present invention, a baseplate supporting pin is provided, which comprises: a pin body; a heating device embedded into the pin body; and a first control unit electrically connected to the heating device for controlling the heating device. Furthermore, according to embodiments of present invention, a baseplate supporting device is provided, which comprises: a baseplate support member; and a baseplate supporting pin, provided to ascend or descend through an opening formed in the baseplate supporting plate so as to support the baseplate thereon or place the baseplate on the baseplate support member, wherein the baseplate supporting pin comprises: a pin body; a heating device built in the pin body; and a first control unit electrically connected to the heating device for controlling the heating device. The baseplate supporting pin and the baseplate supporting device facilitate eliminating adverse effect caused by uneven heating of the baseplate.

12 Claims, 2 Drawing Sheets

(51) Int. Cl.
 *H01L 21/67* (2006.01)
 *H01L 21/687* (2006.01)

(56) References Cited

FOREIGN PATENT DOCUMENTS

| JP | 02073619 A | | 3/1990 |
|---|---|---|---|
| JP | 2002-500432 | * | 1/2002 |
| JP | 2002-500432 A | | 1/2002 |
| JP | 2006-324559 A | | 11/2006 |
| KR | 1020030069272 A | | 10/2003 |
| KR | 10-2004-0020419 | * | 3/2004 |
| KR | 20040020419 A | | 3/2004 |
| KR | 1020050033288 A | | 4/2005 |
| KR | 20080053587 A | | 6/2008 |
| KR | 10-2008-0096115 | * | 10/2008 |
| KR | 20080096115 A | | 10/2008 |
| WO | 2011030607 A1 | | 3/2011 |
| WO | 2011/136604 A2 | | 11/2011 |

OTHER PUBLICATIONS

Korean Office Action dated May 29, 2014; Appln. No. 10-2013-7020461.
International Preliminary Report on Patentability dated Oct. 21, 2014; PCT/CN2013/072891.
Korean Notice of Allowance dated Nov. 26, 2014; Appln. No. 1020137020461.
Extended European Search Report Appln. No. 13734304.2-1551 / 2840601 PCT/CN2013072891; Dated Sep. 12, 2015.

* cited by examiner

BASEPLATE SUPPORTING PIN AND BASEPLATE SUPPORTING DEVICE USING THE SAME

BACKGROUND

The present invention relates to a baseplate supporting pin as well as a baseplate supporting device using the baseplate supporting pin.

The production line for the liquid crystal display usually achieves film formation by heating the baseplate. The baseplate needs to be placed on the baseplate support member and heated with heating elements interior of the baseplate support member, while before heating, the baseplate needs to be placed on the baseplate supporting pins in advance, and descent to the upper surface of the baseplate support member by ascending and descending of the baseplate supporting pin, and then achieve the heating process.

The baseplate supporting pin presently used in the production line is made from temperature-uncontrollable solid materials, such that two situations would occur during the actual process of heating the baseplate:

The first situation is that the baseplate supporting pin contacts with the baseplate when heating the baseplate, and in this case, the baseplate supporting pin has a temperature lower than the temperature of the surrounding baseplates and would absorb heat from the heated baseplate by heat transfer, causing, a bad film quality and a depressed electrical property of the thin film transistor (TFT);

The second situation is that the baseplate supporting pin is spaced away from the heated baseplate by a certain distance, and in this case, the pore for receiving the baseplate supporting pin has a temperature inconsistent with ambient temperature, similarly causing, for a portion of the baseplate at the pore, a bad film quality and a depressed electrical property of the TFT.

The above two situations would cause such a result that the finished liquid crystal display presents an uneven visual sense, reducing the yield of the production line, and therefore needs for a novel design capable of depressing such effects exist.

SUMMARY

According to embodiments of present invention, a baseplate supporting pin is provided, which comprises: a pin body; a heating device embedded into the pin body; and a first control unit electrically connected to the heating device for controlling the heating device.

Preferably, the heating device is arranged to be adjacent to top end of the pin body to be contacted by the baseplate.

Preferably, the baseplate supporting pin may further comprise: a temperature sensing device, arranged within the pin body for sensing a temperature of a region around the baseplate supporting pin; a second control unit signalingly coupled to the first control unit and the temperature sensing device respectively, for sending control signals to the first control unit based on temperature signals received from the temperature sensing device so as to control the heating device.

According to some embodiments, the baseplate supporting pin may further comprise: a cooling unit located in the pin body; and a third control unit connected with the cooling unit, for controlling the cooling unit to cool the pin body, wherein, the second control unit is signalingly coupled to the third control unit so as to control the cooling unit.

The cooling unit may comprise for example a cooling liquid duct.

Preferably, the cooling liquid duct is provided to be farther from the top end of the pin body than the heating device.

According to some embodiments, the cooling liquid duct may be a separate pipeline embedded in the pin body, or a channel structure directly opened in the pin body.

Additionally or alternatively, the cooling unit may comprise a cooling gas intake pipe and a cooling gas exhaust pipe.

Preferably, the distal end of the cooling gas intake pipe is provided with a multi-orifice gas-expelling apparatus which is a tubular structure with several air vents or a sprayer device with several air vents.

Preferably, the temperature sensing device is arranged to be adjacent to the top end of the pin body contacting with the baseplate and arranged at a periphery of this top end.

According to some embodiments, the pin body may comprise a hollow cavity adjacent to the top end thereof, and the heating device and the temperature sensing device may be located within the hollow cavity.

The third control unit is for example a solenoid valve.

The temperature sensing device is for example a thermocouple.

The heating device is for example a heating wire or an electromagnetic heating device.

According to embodiments of present invention, a baseplate supporting device is further provided, which comprises: a baseplate support member; and a baseplate supporting pin, provided to ascend or descend through an opening formed in the baseplate supporting member so as to support the baseplate thereon or place the baseplate on the baseplate support member, wherein the baseplate supporting pin comprises: a pin body; a heating device built in the pin body; and a first control unit electrically connected to the heating device for controlling the heating device.

BRIEF DESCRIPTION OF THE DRAWINGS

In order to describe the technical solution of the embodiment of present invention more clearly, a brief introduction will be made of the attached drawings of the embodiments. Obviously, the drawings described below relate to only some embodiments of present invention, rather than limiting the present invention.

REFERENCE NUMERALS

Figure 1:
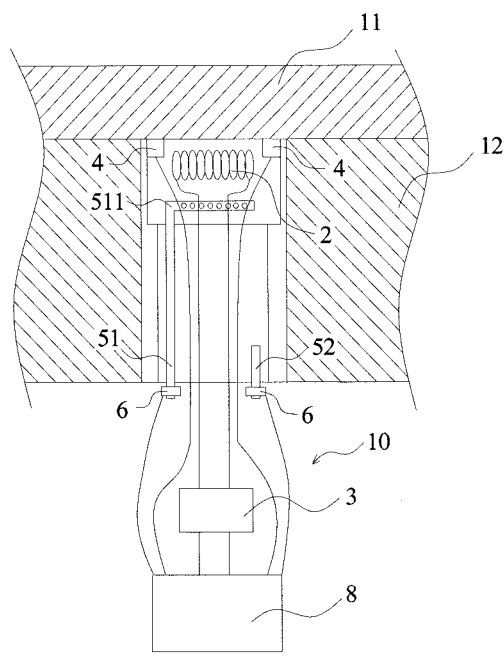
FIG. 1 is a structural schematic view of a baseplate supporting device according to an embodiment of present invention, showing a baseplate being placed on the baseplate support member of the baseplate supporting device.

2—Heating device
3—First control unit
12—Baseplate support member
11—Baseplate
4—Temperature sensing device
8—Second control unit
7—Cooling liquid duct
511—Tubular structure
512—Sprayer device
6—Third control unit 51—Cooling gas intake pipe
52—Cooling gas exhaust pipe
10—Pin body

DETAILED DESCRIPTION

To make clearer the object, technical solutions and advantages of the embodiments of present invention, a clear and full description of the technical solution of the embodiment of present invention will be made with reference to the accompanying drawings of the embodiment of present invention. Obviously, the described embodiments are merely part of the embodiments of the present invention, but not all the embodiments. Based on the described embodiments of present invention, all the other embodiments acquired by the ordinary skilled in this art, without any creative labor, fall into the protective scope of the present invention.

Detail description of the embodiments of present invention will be made in the following, and examples thereof are illustrated in the drawings, throughout which identical or similar elements or elements of identical or similar functions are represented with identical or similar reference numerals.

In the description of the present invention, the terms "upper", "lower", "above", "below" and so on just refer to oriental or positional relationships based on the illustration of the drawings, and only for the purpose of facilitating description of the present invention, rather than limiting the configuration and operation of the present invention to specific orientation, thereby should not be regarded as limitation of the present invention.

FIG. 1 is a structural schematic view of a baseplate supporting device according to an embodiment of present invention, showing a baseplate being placed on a baseplate support member of the baseplate supporting device. As shown in the Figs, the baseplate supporting device comprises a baseplate support member 12 and a baseplate supporting pin. The baseplate supporting pin is provided to ascend or descend through an opening formed in the baseplate supporting member, so as to support the baseplate 11 on the baseplate supporting pin or place the baseplate on the baseplate support member 12.

As shown in FIG. 1, the baseplate supporting pin comprises: a pin body 10; a heating device 2 built in the pin body 10; and a first control unit 3 electrically connected to the heating device 2 for controlling the heating device.

The heating device 2 may be arranged to be adjacent to top end of the pin body to be contacted by the baseplate.

The baseplate supporting pin may provide a heating-up. During heating of the baseplate, electrical current is regulated by the first control unit 3, such that the heating device 2 inside of the baseplate supporting pin heats up to a certain temperature so as to match the heating temperature of the baseplate support member 12 around it. By heating the entire baseplate 11, homogeneity of film quality may be improved, thereby enhancing the electrical property of TFT in the region of the baseplate supporting pin, reducing visual unevenness and increasing the product yield.

In embodiments of present invention, the pin body 10 may comprise ceramic materials, and the heating device 2 is embedded in the pin body 10. As to selection of the heating device 2, a heating wire or an electromagnetic heating device, or other devices suitable for heating the pin body may be used. When the first control unit 3 controls the heating device 2 to heat up, the heating device 2 firstly heats the pin body 10, and subsequently the heated pin body 10 may heat the baseplate (for example, a glass substrate) 11.

In order for the first control unit 3 of the above embodiment be able to control temperatures more accurately, as shown in FIG. 1, the baseplate supporting pin provided by the present invention may further comprise:

a temperature sensing device 4 arranged within the pin body 10 for sensing a temperature of a region around the baseplate supporting pin; and a second control unit 8 signalingly coupled to the first control unit 3 and the temperature sensing device 4 respectively, for sending control signals to the first control unit 3 based on temperature signals received from the temperature sensing device 4.

Accordingly, the first control unit 3 controls the heating device 2, for example, controls the heating device 2 to heat-up, according to control signals received from the second control unit 8.

As such, the first control unit 3 may control the heating device 2 based on an actual temperature of the baseplate support member 12 around the baseplate supporting pin, such that the temperature of the pin body 10 matches the ambient temperature.

The temperature sensing device 4 may be various kinds of devices, for example, a thermocouple or a temperature probe. The second control unit 8 may be a information receiving and processing center, such as, a control centre for a console apparatus, which can receive information from the temperature sensing device and process the same, then send a control signal to the first control unit 3 such that the first control unit 3 performs a heating-up control of the heating device 2.

The temperature sensing device 4 may be signalingly coupled, as an independently working device, to the second control unit 8. As shown in FIG. 1, when in use, the temperature sensing device 4 senses a temperature of a region of the baseplate 11 corresponding to the baseplate supporting pin, and sends data to the second control unit 8. Preferably, the temperature sensing device 4 is arranged to be adjacent to the top end of the pin body 10 to be contacted by the baseplate and arranged at a periphery of this top end.

Other sensing devices also may be provided for measuring temperatures of other heated zones of the baseplate 11, and measurements are sent to the second control unit 8. The second control unit 8 may compare the above two measurements with each other, and then feed back instructions to the first control unit 3 which controls the heating device 2 inside of the baseplate supporting pin, and the first control unit 3 regulates the temperature of the baseplate supporting pin so as to make the temperature of the region of the baseplate 11 corresponding to the baseplate supporting pin 11 consistent with other heated zones of the baseplate 11.

The pin body 10 needs to be cooled-down along with the baseplate support member 12 when the baseplate support member 12 is cooled-down. The baseplate supporting pin according to embodiments of present invention may further comprise: a cooling unit located in the pin body 10; and a third control unit 6 connected with the cooling unit, for controlling the cooling unit so as to cool the pin body, wherein the second control unit 8 is signalingly couple to the third control unit 6 so as to control the cooling unit.

Figure 4:
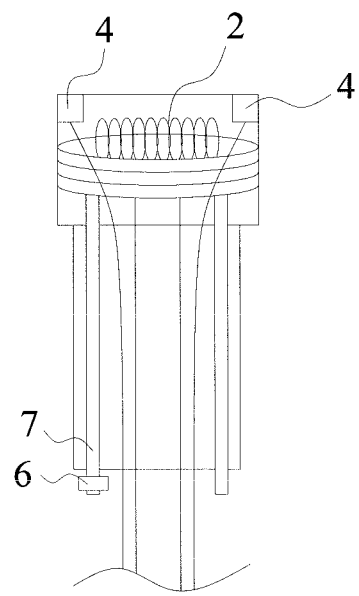
FIG. 4 is a structural schematic view of a baseplate supporting pin according to an embodiment of present invention.

FIG. 4 is a structural schematic view of a baseplate supporting pin according to an embodiment of present invention. In the embodiment of FIG. 4, the cooling unit may be a cooling liquid duct 7. The cooling liquid duct 7 may be evenly built in the pin body 10 as a separate pipeline; and by flowing the low-temperature liquid inside the pipelines, the pin body 10 may be cooled-down quickly. Of course, it is also possible that the interior of the pin body 10 is directly formed with a cooling liquid duct having a channel structure, such that the cooling liquid flows into the cooling liquid duct, which may achieve cooling-down effect in a similar way. The inflow/ outflow of the cooling liquid into/from the pin body 10 is accomplished by the third control unit 6. The Third control unit 6 is a cooling regulating device, for example, a solenoid valve. The third control unit 6 is signalingly coupled with the second control unit 8, and based on the information fed back from the second control unit 8, flow regulation of the cooling medium may be carried out, thereby achieving the purpose of being cooled-down and realizing the desired temperature control. The specific medium flowing in the cooling liquid duct 7 may be liquid mediums capable of achieving a temperature drop, such as water, oil or the like.

Due to the fact that the heating device 2 is located adjacent to the top end of the pin body 10 to be contacted by the baseplate, the cooling liquid duct 7 should not be sandwiched between the top end of the pin body and the heating device 2. Otherwise, the thermal radiation would be affected and the liquid within the cooling liquid duct 7 would be heated to expand, causing pipeline fracture. Therefore, the cooling liquid duct 7 is preferably provided to be farther from the top end of the pin body 10 than the heating device 2. As an example, as shown in FIG. 4, the cooling liquid ducts 7 may be adhered to the sidewall of the hollow cavity of the pin body and arranged in an encircling way. The cooling liquid ducts 7 protrude from the bottom of the pin body and provided with solenoid valves controlled by the second control unit 6, thus its possible to achieve regulation of the heating-up or cooling-down of the baseplate supporting pin through cooperation with the temperature sensing devices and the heating device 2.

In one embodiment of the present invention, as shown in FIG. 1, the pin body may be designed to have a hollow cavity adjacent to its top end, and the heating device 2 and the temperature sensing device 4 are provided in the hollow cavity adjacent to the top end of the pin body. The Heating device 2 is electrically connected to the first control unit 3, and is controlled by the first control unit 3 to achieve the heating-up or cooling-down. When assembled, the heating device 2 needs to be spaced away from the top end of the pin body by a certain distance, without any direct contact. During the heating process, the top end of the pin body is heated with irradiation, thereby performing heat transfer to the baseplate 1 contacted thereto and heating-up the baseplate 11. Another situation may be that, when the baseplate supporting pin retracts into the opening of the baseplate support member 12, the top end of the pin body does not contact with the baseplate 11, but with a certain distance therebetween. In such case, the heated top end of the pin body would cause thermal radiation to the baseplate 11, and in this manner, it's also possible to heat the baseplate 11.

Working principles of the heating device 2 and the temperature sensing device 4 of the baseplate supporting pin have been described with reference to the above embodiments. For the purpose of a better match between the temperature regulation of the baseplate supporting pin and the temperature in other zones of the baseplate 11, additionally or alternatively, another cooling unit may be provided in the hollow cavity of the pin body, for example, including a cooling gas intake pipe 51 for letting in the cooling gas and a cooling gas exhaust pipe 52 for venting cooling gas. As shown in FIG. 1, when the hollow cavity of the pin body is fed with a cooling gas, the temperature of the baseplate supporting pin may be lowered rapidly. When other zones of the baseplate 11 is relatively low, it's not necessarily sufficient to meet matching requirement only by cooling the heating device 2 at a room temperature, and therefore, a device allowing a cooling gas to be fed into is added such that the cooling gas may assist the heating device to be cooled down rapidly. The Cooling gas intake pipe 51 and the cooling gas exhaust pipe 52 are provided with a third control unit (for example, a solenoid valve) 6 outside of the baseplate supporting pin, the third control unit 6 cooperates with the temperature sensing device 4 and the heating device 2 to achieve the regulation of heating-up or cooling-down of the baseplate supporting pin.

Figure 2:
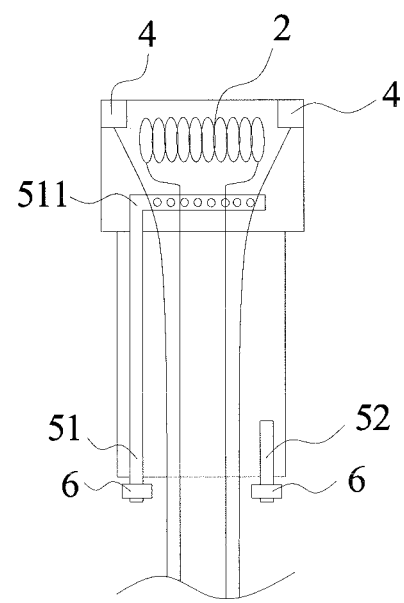
FIG. 2 is a structural schematic view of a baseplate supporting pin according to an embodiment of present invention.
Figure 3:
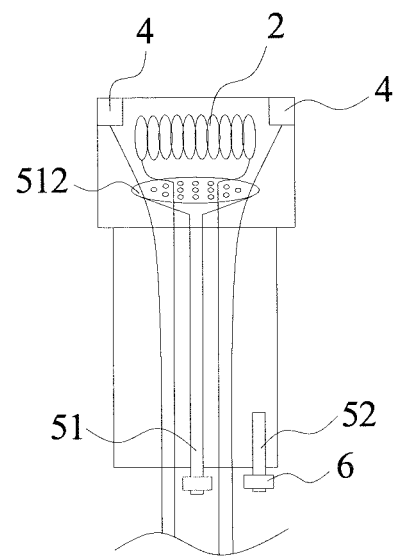
FIG. 3 is a structural schematic view of a baseplate supporting pin according to an embodiment of present invention.

A multi-orifice gas-expelling apparatus may be provided at the distal end of the cooling gas intake pipe 51, so as to cool-down the top end of the baseplate supporting pin uniformly. There may be various specific configurations for the multi-orifice gas-expelling apparatus. For example, it may be a tubular structure 511 with several air vents, as shown in FIG. 2. That is, several rows of through holes are opened simultaneously at the pipe wall of one pipeline, each of which may transport cooling gas outwards, thus enlarging the venting area and cooling the baseplate supporting pin more rapidly. In addition, the multi-orifice gas-expelling apparatus may also be a sprayer device 512 with several air vents, as shown in FIG. 3. Its concrete configuration is similar to that of a shower sprayer, wherein the through holes thereon face directly towards the top end of the baseplate supporting pin, and its cooling-down effect is much more obvious.

In the baseplate supporting pin according to embodiments of present invention, by providing a heating device, a temperature sensing device for measuring an ambient temperature and a cooling-down device within the baseplate supporting pin, a better temperature regulation of the baseplate supporting pin can be achieved, such that the following cases would not occur: an overlow local temperature appears for the baseplate when being heated, causing a bad film quality and a depressed electrical property of the TFT, thereby reducing visual unevenness presented by the finished liquid crystal display, enhancing the yield of product, reducing the possibility of producing defective products, and saving cost. Although embodiments of present invention have been illustrated and described, various alteration, adaptation, substitution and modification could be made to these embodiments without departing from the principle and purpose of the present invention as would be understood by the skill in this art, the scope of the present invention is defined by the claims and its equivalent.

What is claimed is:

1. A baseplate supporting pin, comprising a pin body, wherein the baseplate supporting pin further comprises:
   a heating device built in the pin body,
   a cooling unit located in the pin body; and
   a first control unit electrically connected to the heating device for controlling the heating device;
   wherein the cooling unit comprises a cooling liquid duct, and the cooling liquid duct is arranged to be farther from the top end of the pin body than the heating device;
   wherein the cooling unit further comprises a cooling gas intake pipe and a cooling gas exhaust pipe; and
   wherein the distal end of the cooling gas intake pipe is provided with multi-orifice gas-expelling apparatus, which is a tubular structure with several air vents or a sprayer device with several air vents.

2. The baseplate supporting pin according to claim 1, wherein the heating device is arranged to be adjacent to top end of the pin body to be contacted by the baseplate.

3. The baseplate supporting pin according to claim 1, further comprising:
   a temperature sensing device arranged within the pin body for sensing a temperature of a region around the baseplate supporting pin;
   a second control unit signalingly coupled to the first control unit and the temperature sensing device respectively, for sending control signals to the first control unit based on temperature signals received from the temperature sensing device so as to control the heating device.

4. The baseplate supporting pin according to claim 3, further comprising:
a third control unit connected with the cooling unit, for controlling the cooling unit so as to cool the pin body, wherein the second control unit is signalingly coupled to the third control unit to control the cooling unit.

5. The baseplate supporting pin according to claim 1, wherein the cooling liquid duct is a pipeline embedded in the pin body, or a channel structure directly opened in the pin body.

6. The baseplate supporting pin according to claim 3, wherein the temperature sensing device is arranged to be adjacent to the top end of the pin body to be contacted by the baseplate and located at a periphery of the top end.

7. The baseplate supporting pin according to claim 6, wherein the pin body has a hollow cavity adjacent to the top end thereof, and the heating device and the temperature sensing device are located within the hollow cavity.

8. The baseplate supporting pin according to claim 4, wherein the third control unit is a solenoid valve.

9. The baseplate supporting pin according to claim 3, wherein the temperature sensing device is a thermocouple.

10. The baseplate supporting pin according to claim 1, wherein the heating device is a heating wire or an electromagnetic heating device.

11. A baseplate supporting device, comprising:
a baseplate support member; and
a baseplate supporting pin, configured to ascend or descend through an opening formed in the baseplate supporting member so as to support the baseplate thereon or place the baseplate on the baseplate support member,
wherein the baseplate supporting pin comprises: a pin body; a heating device built in the pin body; a cooling unit located in the pin body; and a first control unit electrically connected to the heating device for controlling the heating device; the cooling unit comprises a cooling liquid duct, and the cooling liquid duct is arranged to be farther from the top end of the pin body than the heating device;
wherein the cooling unit further comprises a cooling gas intake pipe and a cooling gas exhaust pipe; and
wherein the distal end of the cooling gas intake pipe is provided with multi-orifice gas-expelling apparatus, which is a tubular structure with several air vents or a sprayer device with several air vents.

12. The baseplate supporting pin according to claim 1, wherein the cooling liquid duct is a pipeline embedded in the pin body, or a channel structure directly opened in the pin body.

\* \* \* \* \*